United States Patent
Kamir et al.

[11] Patent Number: 5,942,137
[45] Date of Patent: Aug. 24, 1999

[54] METHOD AND APPARATUS FOR LASER SCRIBING GROOVES ON HARD CRYSTALS

[75] Inventors: Yosef Kamir, Netanya; Josef Ronen, Herzelia, both of Israel

[73] Assignee: Scitex Corporation Ltd., Herzelia, Israel

[21] Appl. No.: 08/920,557

[22] Filed: Aug. 29, 1997

[51] Int. Cl.[6] .................................................. B23K 26/00
[52] U.S. Cl. ............................ 219/121.68; 219/121.69
[58] Field of Search ........................ 219/121.68, 121.69, 219/121.82, 121.84, 121.83; 156/245; 359/323; 269/21

[56] References Cited

U.S. PATENT DOCUMENTS

| | | | |
|---|---|---|---|
| 4,141,456 | 2/1979 | Hart | 219/121.68 |
| 4,869,768 | 9/1989 | Zola | 156/245 |
| 5,059,764 | 10/1991 | Baer | 219/121.68 |
| 5,221,989 | 6/1993 | Stappaerts et al. | 359/323 |
| 5,310,990 | 5/1994 | Russell et al. | 219/121.69 |
| 5,611,946 | 3/1997 | Leong et al. | 219/121.68 |
| 5,744,780 | 4/1998 | Chang et al. | 219/121.68 |

FOREIGN PATENT DOCUMENTS

| | | |
|---|---|---|
| 8-1367 | 1/1996 | Japan . |
| 8-309576 | 11/1996 | Japan . |

*Primary Examiner*—Geoffrey S. Evans
*Attorney, Agent, or Firm*—Darby & Darby

[57] ABSTRACT

Apparatus for positioning, holding and surface processing a small dimensioned hard crystal is provided. The apparatus includes a position location jig for positioning the crystal in an x-y plane, vacuum pump apparatus for generating a vacuum to grip the crystal in the x-y plane, copper vapor laser apparatus for surface processing, including scribing or drilling the hard crystals and projection microscope apparatus mounted on the laser for accurate location of the processing area.

10 Claims, 6 Drawing Sheets

METHOD AND APPARATUS FOR LASER SCRIBING GROOVES ON HARD CRYSTALS

FIELD OF THE INVENTION

The present invention relates to the surface processing in general and to the scribing of grooves on hard crystals in particular.

BACKGROUND OF THE INVENTION

Hard crystals such as PLZT (lead lanthanum zirconate titanate) or KTN (Potassium Tantalum Neodymium) are widely used in optoelectronic storage and display devices. The PLZT crystal is a ferroelectric, ceramic, electrooptical material having optical properties which can be changed by an electric field or by being placed in tension or compression.

These crystals are hard but brittle and though they can be cut and polished by conventional ways, it is extremely difficult to shape small 3-D patterns on their surfaces. High powered lasers, such as a carbon dioxide ($CO_2$) laser, Nd:Yag laser or Excimer laser, can be used. However these conventional lasers have disadvantages. Even because of high absorption, the crystal becomes heated and can reach temperatures close to or even above Curie temperature. These high temperatures cause the loss of the crystal's optical properties, particularly in the region surrounding the processing area.

Copper vapor laser (CVL) are also known in the art of laser etching. In general, the copper vapor laser has an extremely high photon gain and large active aperture. By combining the copper vapor laser with the magnification capabilities of a projection microscope, it is possible to obtain a resolution of one micron. Using very fast pulsed (CVL) the brittle crystal can be "chipped" away or "crumbled" in ordered manner, confined to very small area—without heating. Thus, surface processing, such as etching, drilling and cutting can be performed on a marked area as small as 2 microns.

However, though surface processing can be carried out accurately on extremely small areas, using a projection microscope based on a copper vapor laser, for delicate work on a hard crystal, such as PLZT, it is essential that the crystal be accurately located. The x-y placing of the crystal is especially critical where etching and/or cutting is carried out close to each other.

SUMMARY OF THE INVENTION

An object of the present invention is to provide a method and apparatus for surface processing on small areas of hard crystals which overcome the disadvantages of prior methods.

A further object of the present invention is to provide a method and apparatus for accurately scribing grooves on small areas of hard crystal.

There is thus provided, in accordance with a preferred embodiment of the present invention, apparatus for positioning, holding and surface processing a small dimensioned hard crystal. The apparatus includes a position location jig for positioning and locating the crystal in an x-y plane, vacuum pump means for generating a vacuum to grip the crystal in the x-y plane, copper vapor laser apparatus for surface processing the hard crystals and projection microscope apparatus mounted on the laser for accurate location of the processing area.

Furthermore, in accordance with a preferred embodiment of the present invention, the surface processing includes scribing or drilling the crystals. The scribing includes scribing symmetrical grooves on two parallel surfaces of the crystal.

Additionally, there is also provided, in accordance with a preferred embodiment of the present invention, a jig for positioning and holding a crystal during surface processing. The jig includes apparatus for positioning and locating the crystal in an x-y plane and vacuum pump means for generating a vacuum to grip the crystal in the x-y plane.

Furthermore, in accordance with a preferred embodiment of the present invention, the crystal is a ferroelectric, ceramic, electrooptical material. The crystal includes any of a group of crystals including PLZT (lead lanthanum zirconate titanate) and KTN (Potassium Tantalum Neodymium).

Additionally, there is also provided, in accordance with a preferred embodiment of the present invention, a method for surface processing small dimensioned crystals. The method includes the steps of:

a) positioning the crystal on a jig in an x-y plane;

b) generating a vacuum to grip the crystal in the x-y plane;

c) placing the jig on an x-y translation stage of a projection microscope;

d) moving the x-y translation stage into position by means of the projection microscope for surface processing the crystal;

e) utilizing a copper vapor laser to surface process the crystal; and f) repeating steps d and e for each location on the surface of the crystal to be processed until surface processing is completed.

Furthermore, in accordance with a preferred embodiment of the present invention, the method further includes the steps of:

a) releasing the vacuum grip on the crystal;

b) lifting the crystal off the jig;

c) replacing the crystal on the jig with the processed surface adjacent to the jig;

d) positioning the crystal on the jig in an x-y plane;

e) regenerating a vacuum to grip the crystal in the x-y plane; and f) surface processing the reverse surface of the crystal.

In addition, in accordance with a preferred embodiment of the present invention, the method also includes the steps of:

a) moving the x-y translation stage into position by means of the projection microscope;

b) utilizing a copper vapor laser to surface process the crystal; and c) repeating steps a and b for each location on the reverse surface of the crystal to be processed until surface processing is completed.

The step of surface processing includes the step of scribing symmetrical grooves on two parallel surfaces of the crystal.

Finally, the crystal is gripped by vacuum apparatus during the steps of lifting, replacing and positioning.

BRIEF DESCRIPTION OF THE DRAWINGS

The present invention will be understood and appreciated more fully from the following detailed description taken in conjunction with the appended drawings in which:

FIGS. 6A and 6B are a flow chart illustration of the method for performing surface processing.

DETAILED DESCRIPTION OF THE PRESENT INVENTION

Wafer crystals, such as PLZT crystal, are generally very small and thin. Exemplary dimensions such crystals are approximately between 500–700 microns width and between 200–300 microns thick, having an overall length of approximately 12–20 mm.

Figure 1:
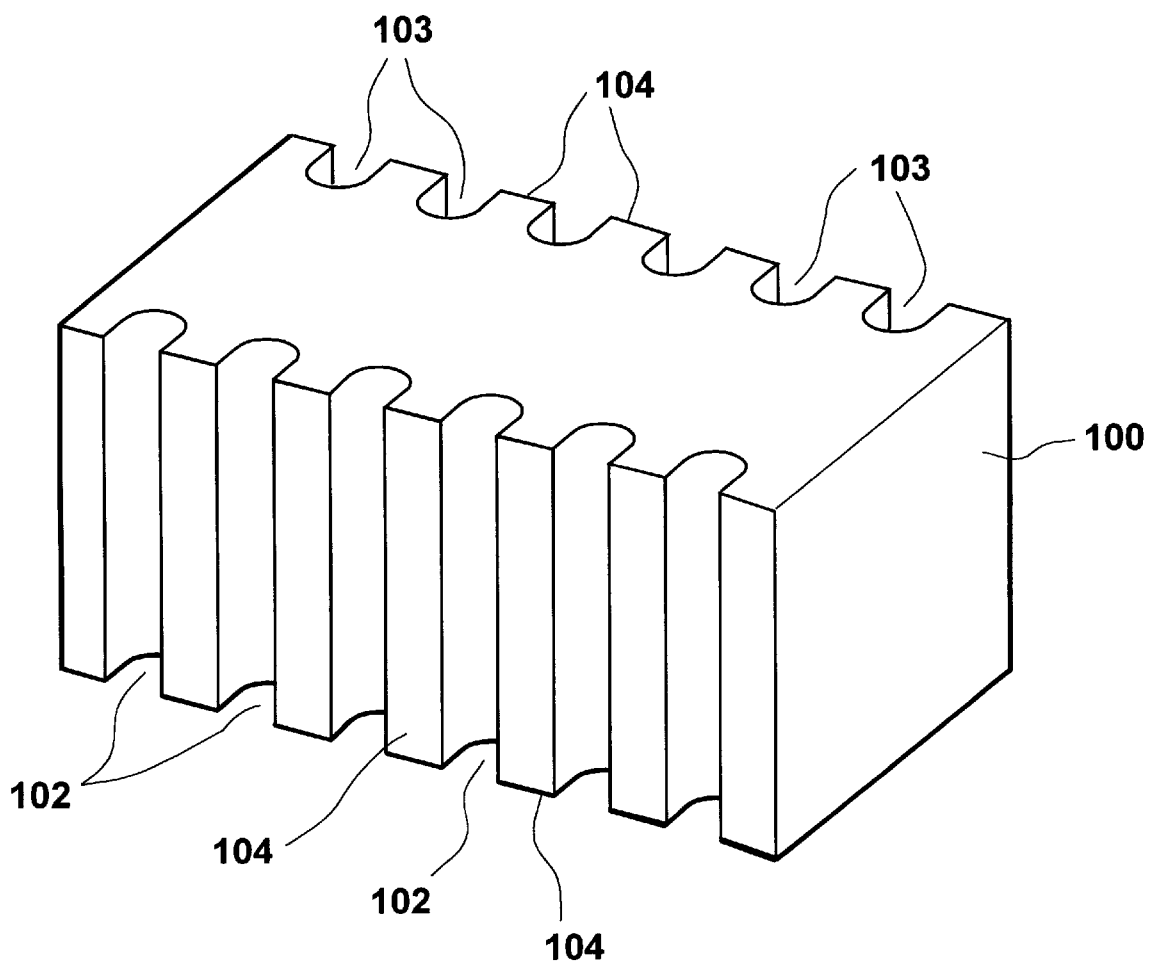
FIG. 1 is a schematic isometric illustration of a fabricated flat crystal having a plurality of registrated channels cut into opposite faces thereof according to a preferred embodiment of the present invention.

FIG. 1 is a schematic isometric illustration of part of a flat fabricated PLZT crystal 100 having a plurality of registered channels 102 and 103 cut into opposite faces thereof, according to a preferred embodiment of the present invention. Each segment 104 of crystal is separated by a channel 102 (or 103).

In the example of FIG. 1, each channel 102 (and 103) is extremely small between 6 to 25 microns wide, for example. It is thus, possible to fabricate a large number of such channels (that is, over 50) in each face of a standard 12–20 mm long crystal. It will be appreciated that the dimensions are given by way of example only and without in any way limiting the scope of the invention.

Applicants of the present invention have realized that, by constructing a specialized jig to correctly position a crystal in the x and y direction and simultaneously firmly holding the crystal in position, it is possible to accurately fabricate a plurality of tiny channels within a crystal without damaging the crystal.

By utilizing Copper Vapor Laser (CVL) technology, a plurality of registered channels 102 having exceptionally small dimensions (described above) can be fabricated on each side of the crystal 100.

Figure 2:
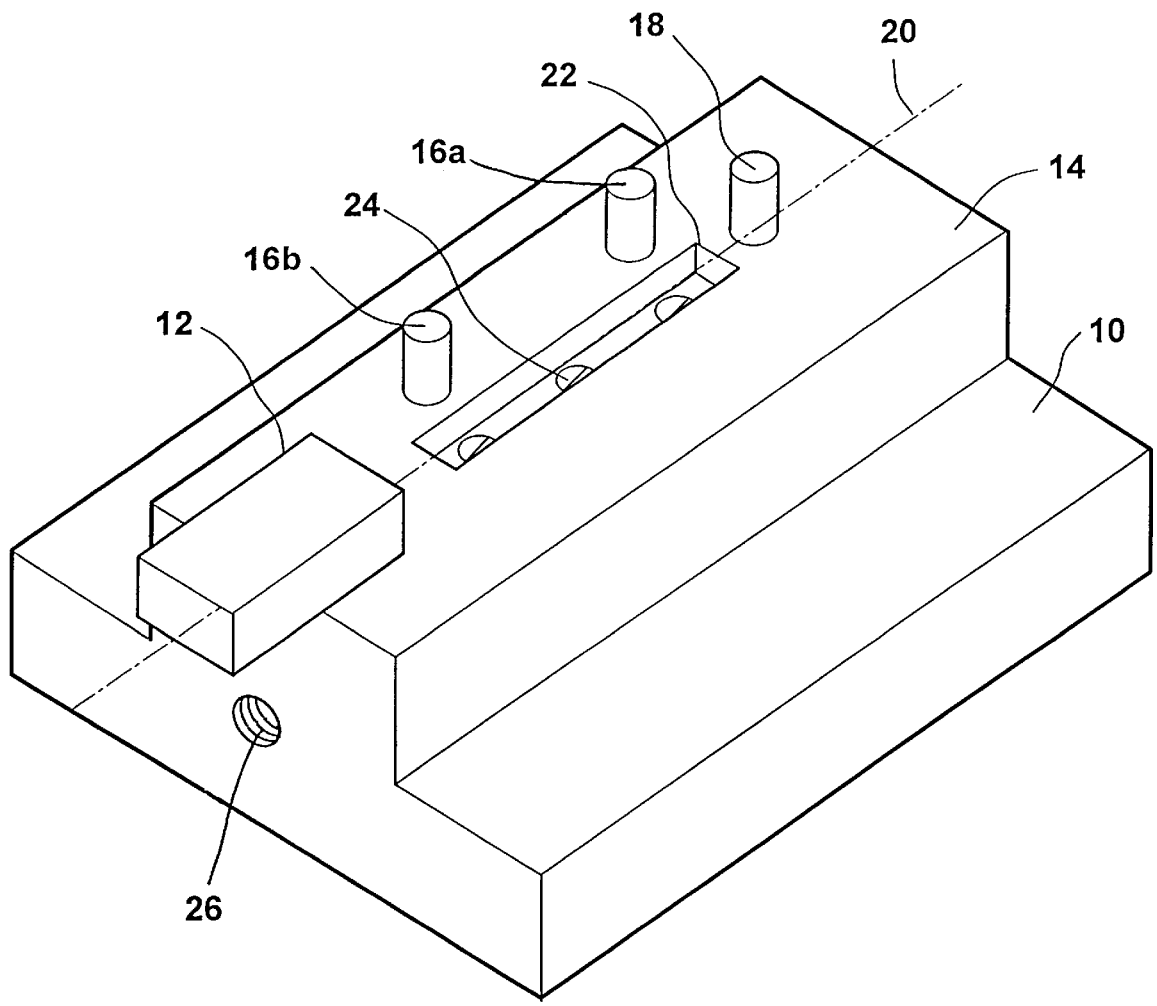
FIG. 2 is a schematic isometric illustration of a jig for supporting and holding a crystal, according to a preferred embodiment of the present invention.
Figure 2:
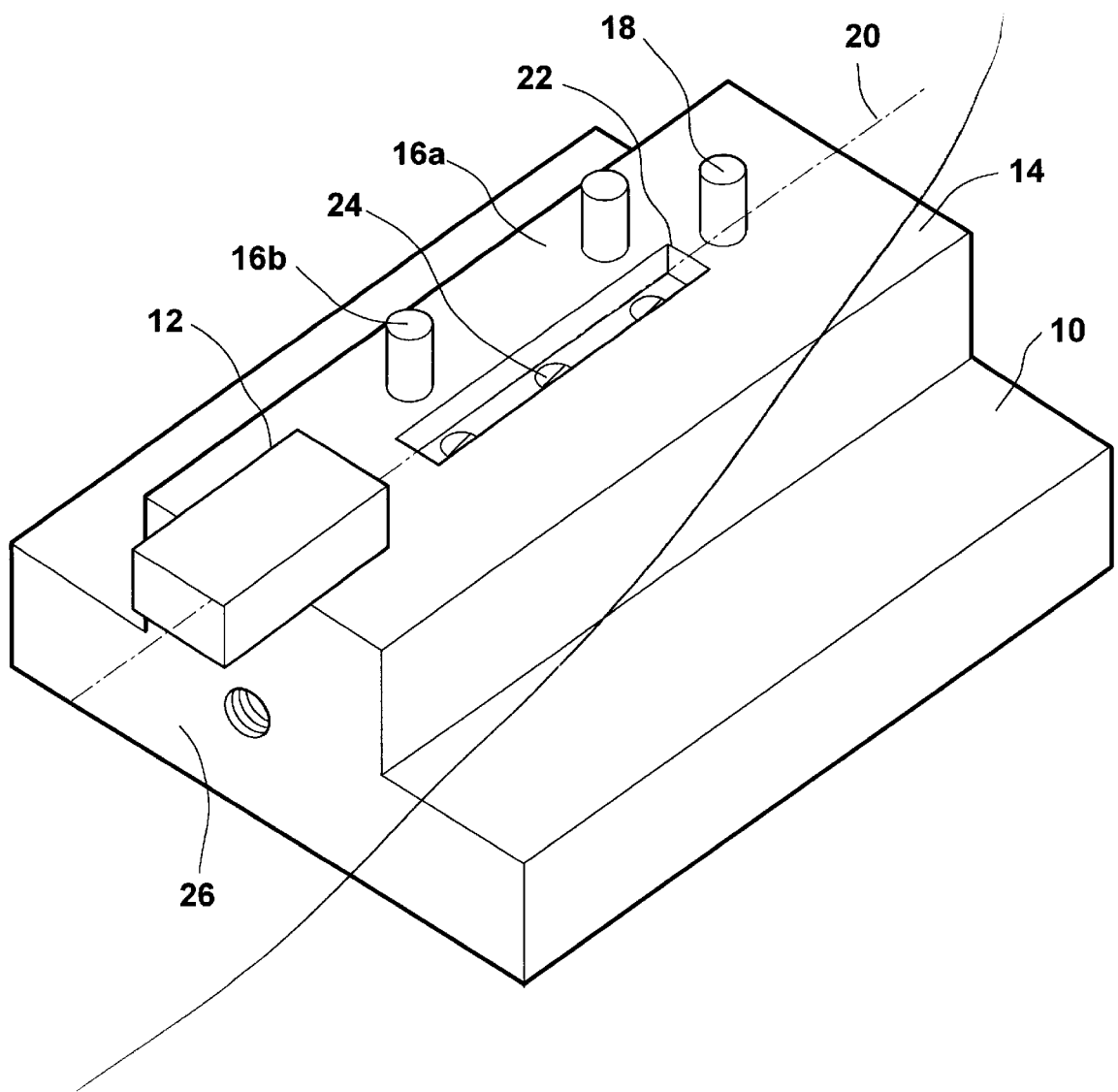
Figure 3:
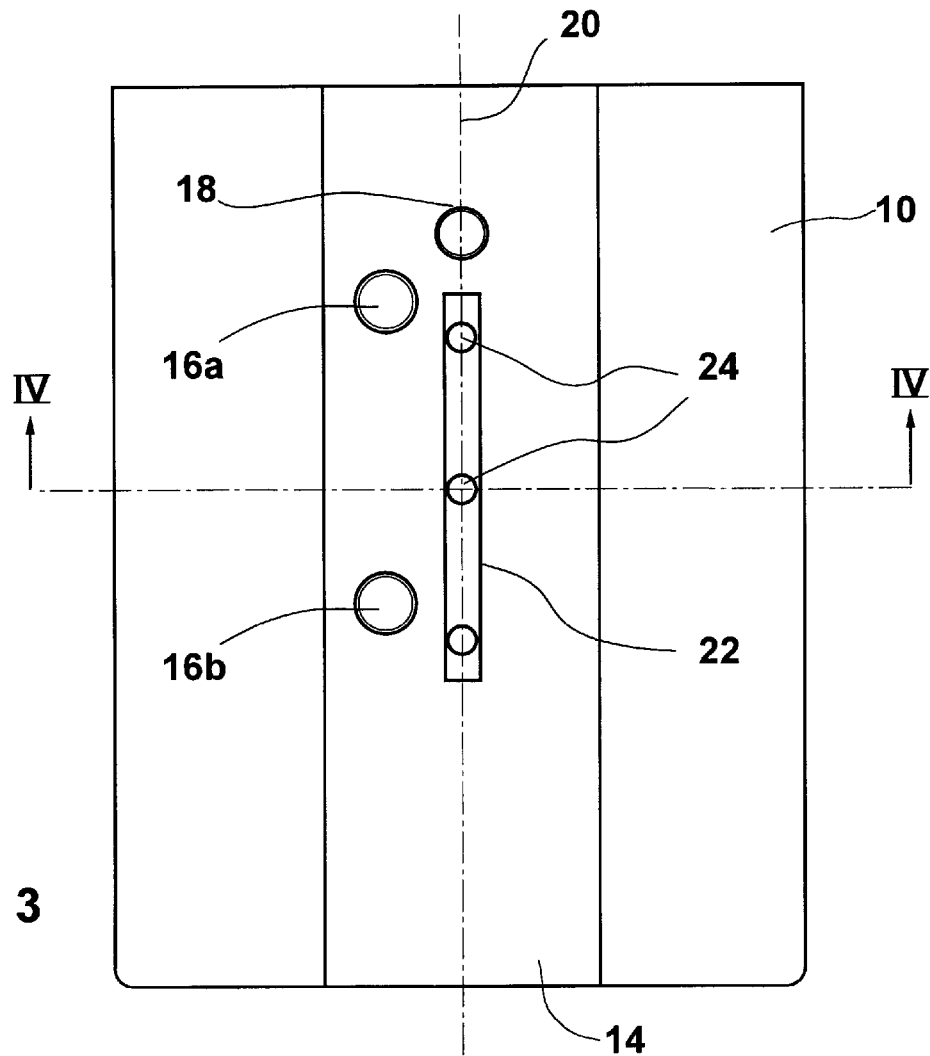
FIGS. 3 and 4 are plan and sectional elevation illustrations of jig of FIG. 2.
Figure 4:
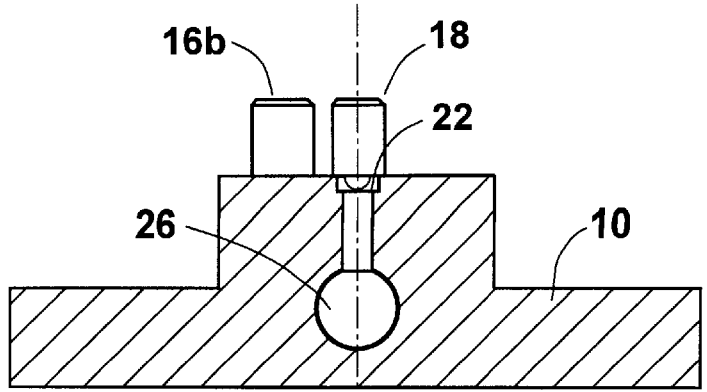

Reference is now made to FIGS. 2, 3 and 4. FIG. 2 is an isometric view of a jig 10 for supporting and holding a crystal 12, according to a preferred embodiment of the present invention, so as to enable surface processing work to be carried out on the crystal. FIGS. 3 and 4 are plan and sectional elevation illustrations, respectively, of jig 10. Crystal 12 is a standard crystal which has been prepared, by know methods, to a precise rectangular form (for example) to the required dimensions.

A feature of the invention is that crystal 12 can be correctly positioned in on jig 10 to allow for symmetrical processing on opposite faces of the crystal. Additionally, the crystal 12 is firmly held in that position by vacuum means.

Jig 10 is generally an inverted "T"-shaped block (when viewed from the side (FIG. 4)), having a central upstand section 14. Upstand 14 comprises a pair of side location pins 16a and 16b, and a central location pin 18 protruding from upstand 14. Central location pin 18 is precisely located in the center of upstand 14, as indicated by center line, referenced 20. Central location pin 18 precisely locates the position of the "head" of the crystal 12 so that when the crystal is turned over (for processing on the reverse side), by positioning the "head" of the crystal against the central pin 18, the crystal can be correctly located vis-a-vis the first surface.

Upstand 14 further comprises a generally rectangular channel 22 having plurality of apertures 24 formed therein. Channel 22 is formed on top of upstand 14 and located adjacent to pins 16a and 16b and along center line 20.

A generally cylindrical conduit 26 is formed within the upstand 14, extending below and connected to the plurality of apertures 24.

A vacuum pump (not shown) is suitably attached to conduit 26 to ensure a sealed connection.

In operation, the crystal 12 to be worked on, is placed on jig 10 in contact with side location pins 16a and 16b, and central location pin 18, thereby correctly positioning the crystal. A vacuum is then applied, via conduit 26 and apertures 24 to the crystal 12. The resulting suction grips the crystal 12 and prevents it from moving.

Figure 5:
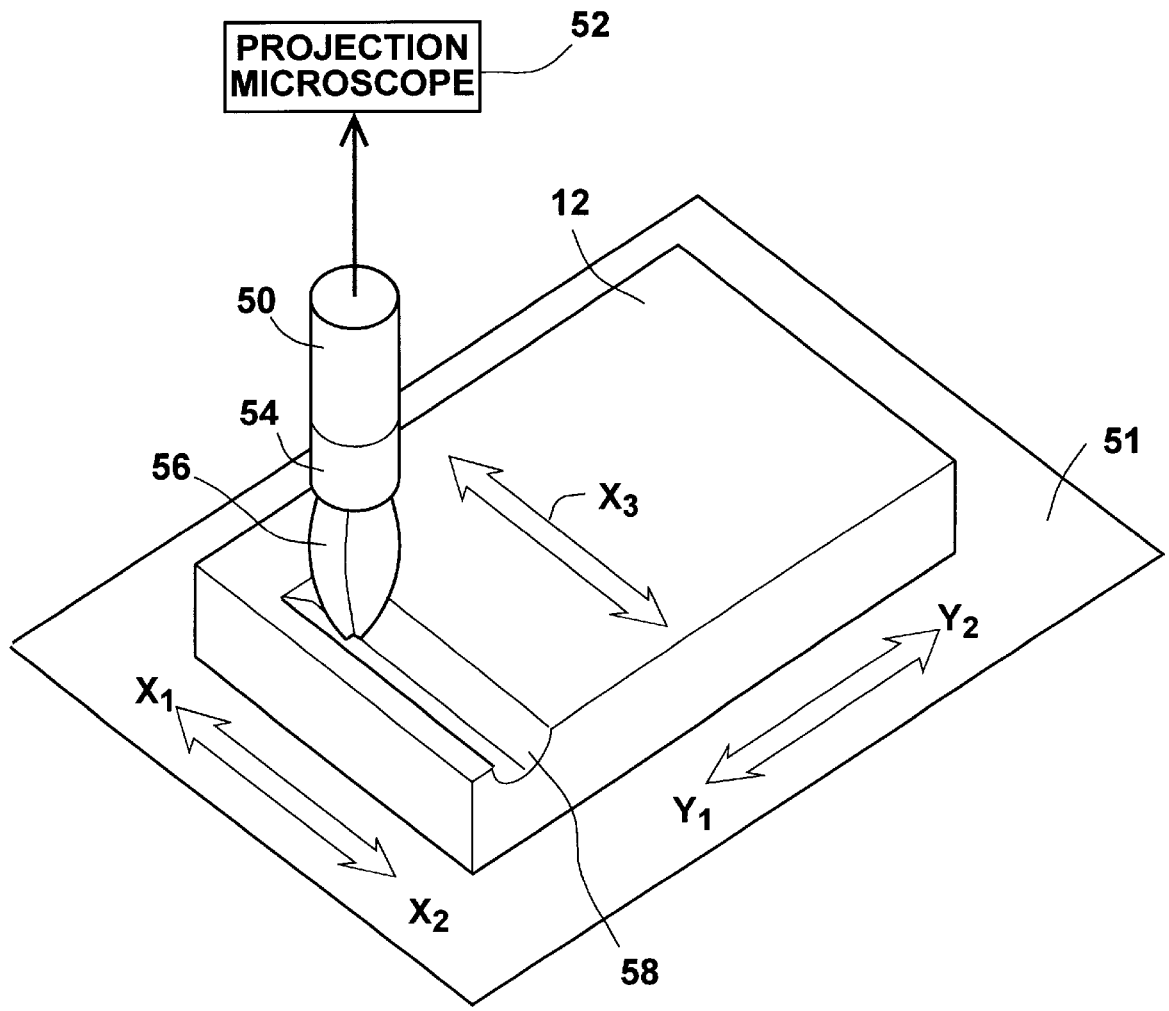
FIG. 5 is an enlarged isometric detail illustrating the use of a copper vapor laser (CVL) for surface processing on the crystal of FIG. 2.

Reference is now made to FIG. 5 which is an enlarged isometric detail illustrating the use of a copper vapor laser (CVL) 50 for etching crystal 12. The crystal 12 is tightly held in position on jig 10 (not shown) by vacuum, as described hereinabove. The jig 10 is placed on an x-y translation stage 51 (work table)—not shown—, and moved into the precise position for processing by adjusting the table along the X-Y planes, schematically represented by arrows, referenced $X_1$.–$X_2$ and $Y_1$.–$Y_2$.

Preferably, processing is carried out by a system using a projection microscope 52 and copper vapor laser 50 (CVL). Any suitable projection microscope system using CVL which allows for a very high optical magnification of high magnitude may be used. An exemplary system is commercially available from Rotem Industries Ltd. of Beersheva, Israel. For the purposes of example only and without in any way limiting the scope of the invention, the projection microscope should be capable of magnification of approximately x5000 and the copper vapor laser should permit a 0.7 $\mu$m resolution. Arrow X3 indicates the longitudinal movement of the translation stage 51 in relation to the static CVL during processing.

The system allows the operator to mark any area on the image as low as $2\mu$ diagonal squares for surface processing. When the CVL laser is activated, the CVL plasma tube 54 is excited by electric discharge pulses to emit photons near the green and yellow colors to produce a laser beam 56. The beam 56 operates to perform the surface processing, such as etching or drilling or for cutting a channel 58, as shown in FIG. 5. Channel 58 is similar to 102 and 103 described hereinabove with respect to FIG. 1.

It will be appreciated that channel 58 (or 102) may be configured to any suitable shape and is not restricted to the semi-circular cross-section illustrated in FIG. 5.

On completion of the surface processing, the vacuum is released and the crystal wafer 12 is lifted off the jig 10, preferably by a vacuum pen, such as the "air pinette" model incorporating a vacuum pad and vacuum generator, manufactured by Nihon Pisco Co. Ltd. of Okaya City, Japan, or similar and turned over for processing on the reverse face, if required.

On completion of processing on both faces, the fabricated crystal 12 is similar to the PLZT crystal 100 of FIG. 1 (described hereinabove).

Figure 6A:
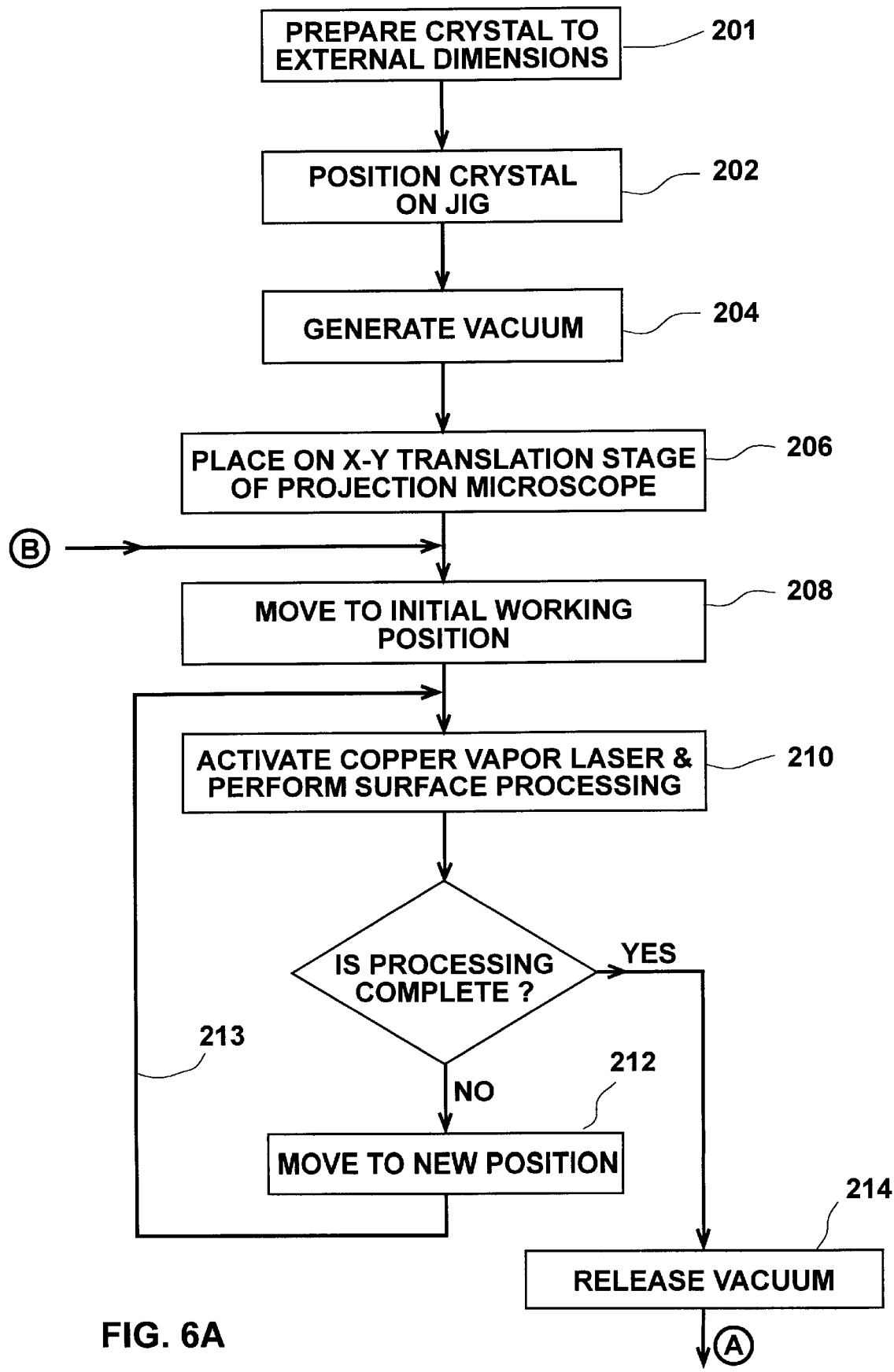

Reference is now also made to FIGS. 6A and 6B which are a flow chart illustration of the method for performing surface processing, such as etching, drilling and cutting on crystal 12. The method described is based on the use of a projection microscope 52 and copper vapor laser 50 (CVL), described hereinabove with respect to FIG. 5.

The crystal 12 is first fabricated to the required external dimensions (step 201). The crystal 12 is then positioned on jig 10 (step 202) so that the crystal is in contact with side location pins 16a and 16b and central location pin 18, thereby correctly positioning the crystal in the x-y plane. A vacuum is then generated applied by the vacuum pump through conduit 26 to grip the crystal (step 204).

The jig 10 with the crystal 12 gripped in position is placed on the x-y translation stage of the projection microscope 52 (step 206). The x-y translation stage is then moved into the initial working position (step 208), using the high magnification powers of the projection microscope to accurately locate the portion of the surface to be worked on.

The copper vapor laser 54 is then activated to perform the etching or cutting on the marked portion of the crystal (step 210).

The x-y translation stage is then moved to a new working position (step 212) and surface processing step 210 is repeated (loop 213). On completion of the processing for the surface being worked on, the vacuum holding the crystal is released (step 214).

If processing is also to be performed on the reverse surface of the crystal (query step 216), the crystal is removed from the jig (step 218) by means of a vacuum pen or similar, inverted and repositioned on the jig (step 220). The crystal is centered by locating the "head" against the central pin 18 thereby ensuring that the crystal is correctly located vis-a-vis the first surface, so that the surface processing on the reverse surface will be aligned with the surface processing on the other surface.

The vacuum is regenerated (step 222) and processing performed (steps 208–212 for the reverse side.

Finally, the formed crystal is removed, preferably by means of the vacuum pen (step 224).

It will be appreciated that the present invention is not limited by what has been described hereinabove and that numerous modifications, all of which fall within the scope of the present invention, exist. For example, while the present invention has been described with respect to a PLZT crystal, the invention is applicable to any ferroelectric, ceramic, electrooptical material, such as KTN (Potassium Tantalum Neodymium).

It will be appreciated by persons skilled in the art that the present invention is not limited by what has been particularly shown and described herein above. Rather the scope of the invention is defined by the claims which follow:

We claim:

1. Apparatus for positioning, holding and surface processing a small dimensioned hard crystal, said apparatus comprising:
    a) a jig comprising:
        i) position location means for positioning said crystal in an x-y plane;
        ii) vacuum pump means for generating a vacuum to grip said crystal in said x-y plane; and
        iii) a "T"-shaped block having a central upstand section, said upstand comprising:
            a generally rectangular channel formed on the surface of said upstand, said channel having a plurality of apertures formed therein; and
            a conduit formed within said upstand, said conduit being connected to said plurality of apertures;
    b) copper vapor laser means for surface processing said hard crystals; and
    c) projection microscope means mounted on said laser means for accurate location of the processing area.

2. Apparatus according to claim 1 and wherein said position location means comprises:
    a) at least one central location pin protruding from said upstand, said central location pin being located along a central longitudinal axis equidistant from each edge of said upstand thereby defining the center of said upstand; and
    b) at least a pair of side location pins protruding from said upstand, said pair of side location pins being located along a longitudinal axis said longitudinal axis being parallel with said central longitudinal axis.

3. Apparatus according to claim 1 and wherein said vacuum pump means comprises a vacuum pump attached to said conduit.

4. Apparatus according to claim 1 wherein said crystal is a ferroelectric, ceramic, electrooptical material.

5. Apparatus according to claim 1 wherein said crystal comprises any of a group of crystals including PLZT (lead lanthanum zirconate titanate) and KTN (Potassium Tantalum Neodymium).

6. Apparatus according to claim 1 wherein said surface processing comprises scribing or drilling said crystals.

7. A method for surface processing small dimensioned crystals, said method comprising the steps of:
    a) positioning said crystal on a jig in an x-y plane;
    b) generating a vacuum to grip said crystal in said x-y plane;
    c) placing said jig on an x-y translation stage of a projection microscope;
    d) moving said x-y translation stage into position by means of said projection microscope for surface processing said crystal;
    e) utilizing a copper vapor laser to surface process said crystal;
    f) repeating steps d and e for each location on the surface of said crystal to be processed until surface processing is completed;
    g) releasing said vacuum grip on said crystal;
    h) lifting said crystal off said jig;
    i) replacing said crystal on said jig with said processed surface adjacent to said jig;
    j) positioning said crystal on said jig in an x-y plane;
    k) regenerating a vacuum to grip said crystal in said x-y plane; and
    l) surface processing the reverse surface of said crystal.

8. A method according to claim 7 wherein said surface processing of the reverse surface comprises the steps of:
    a) moving said x-y translation stage into position by means of said projection microscope;
    b) utilizing a copper vapor laser to surface process said crystal; and
    c) repeating steps a and b for each location on said reverse surface of said crystal to be processed until surface processing is completed.

9. A method according to claim 7 and wherein said step of surface processing comprises the step of scribing symmetrical grooves on two surfaces of the crystal, said surfaces being on opposite faces of said crystal.

10. A method according to claim 7 wherein said crystal is gripped by vacuum means during said steps of lifting, replacing and positioning.

* * * * *